(12) United States Patent
Zhang et al.

(10) Patent No.: US 9,548,374 B2
(45) Date of Patent: Jan. 17, 2017

(54) HIGH POWER INSULATED GATE BIPOLAR TRANSISTORS

(71) Applicant: Cree, Inc., Durham, NC (US)

(72) Inventors: Qingchun Zhang, Cary, NC (US);
Sei-Hyung Ryu, Cary, NC (US);
Charlotte Jonas, Morrisville, NC (US);
Anant K. Agarwal, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 108 days.

(21) Appl. No.: 14/260,717

(22) Filed: Apr. 24, 2014

(65) Prior Publication Data

US 2015/0287805 A1    Oct. 8, 2015

Related U.S. Application Data

(62) Division of application No. 11/764,492, filed on Jun. 18, 2007, now Pat. No. 8,710,510.

(Continued)

(51) Int. Cl.
*H01L 29/66* (2006.01)
*H01L 29/16* (2006.01)
(Continued)

(52) U.S. Cl.
CPC ... *H01L 29/66068* (2013.01); *H01L 21/02378* (2013.01); *H01L 21/02529* (2013.01);
(Continued)

(58) Field of Classification Search
CPC ............ H01L 29/66068; H01L 21/324; H01L 21/02529; H01L 21/049; H01L 21/046; H01L 29/1608; H01L 29/1095; H01L 29/66333; H01L 21/2254; H01L 21/26513; H01L 21/02378
See application file for complete search history.

(56) References Cited

U.S. PATENT DOCUMENTS 3,439,189 A    4/1969    Petry
3,629,011 A   12/1971    Tohi et al.
(Continued)

FOREIGN PATENT DOCUMENTS

DE    39 42 640 A1    8/1990
DE    198 09 554      9/1998
(Continued)

OTHER PUBLICATIONS

Zhang et al.; Design and Fabrications of High Voltage IGBTs on 4H-SiC; Power Semiconductor Devices and IC's, 2006 IEEE International Symposium in Naples Italy; Jun. 4-8, 2006; pp. 1-4.*
(Continued)

*Primary Examiner* — John P Dulka
(74) *Attorney, Agent, or Firm* — Myers Bigel, P.A.

(57) ABSTRACT

A method of forming a transistor device include forming a drift layer of a first conductivity type, forming a well of a second conductivity type in the drift layer, forming a JFET region with first conductivity type dopant ions in the drift layer, forming a channel adjustment layer of the first conductivity type on the JFET region and the well, implanting first conductivity type dopant ions to form an emitter region of the first conductivity type extending through the channel adjustment layer and into the well, wherein the emitter region is spaced apart from the JFET region by the well, implanting second conductivity type dopant ions to form a connector region of the second conductivity type adjacent the emitter region, forming a gate oxide layer on the channel region, and forming a gate on the gate oxide layer.

24 Claims, 5 Drawing Sheets

Related U.S. Application Data (60) Provisional application No. 60/838,249, filed on Aug. 17, 2006.

(51) Int. Cl.

| | |
|---|---|
| H01L 29/739 | (2006.01) |
| H01L 21/02 | (2006.01) |
| H01L 21/04 | (2006.01) |
| H01L 21/225 | (2006.01) |
| H01L 21/265 | (2006.01) |
| H01L 21/324 | (2006.01) |
| H01L 29/10 | (2006.01) |

(52) U.S. Cl.
CPC .......... *H01L 21/046* (2013.01); *H01L 21/049* (2013.01); *H01L 21/2254* (2013.01); *H01L 21/26513* (2013.01); *H01L 21/324* (2013.01); *H01L 29/1095* (2013.01); *H01L 29/1608* (2013.01); *H01L 29/66333* (2013.01); *H01L 29/7395* (2013.01)

(56) References Cited

U.S. PATENT DOCUMENTS

| | | |
|---|---|---|
| 3,924,024 A | 12/1975 | Naber et al. |
| 4,160,920 A | 7/1979 | Courier de Mere |
| 4,242,690 A | 12/1980 | Temple |
| 4,466,172 A | 8/1984 | Batra |
| 4,581,542 A | 4/1986 | Steigerwald |
| 4,644,637 A | 2/1987 | Temple |
| 4,811,065 A | 3/1989 | Cogan |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A * | 10/1999 | Lipkin .................. H01L 21/049 257/77 |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,410 B1 | 10/2001 | Baliga |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,573,534 B1 * | 6/2003 | Kumar ................ H01L 29/1608 257/328 |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |

(56) References Cited

U.S. PATENT DOCUMENTS

| | | |
|---|---|---|
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,221,010 B2 | 5/2007 | Ryu |
| 7,253,031 B2 | 8/2007 | Takahashi |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 2001/0011729 A1 | 8/2001 | Singh et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0082116 A1 | 4/2004 | Kub et al. |
| 2004/0183079 A1 | 9/2004 | Kaneko et al. |
| 2004/0211980 A1 | 10/2004 | Ryu |
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0181536 A1 | 8/2005 | Tsuji |
| 2005/0230686 A1 | 10/2005 | Kojima et al. |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0086997 A1 | 4/2006 | Kanaya et al. |
| 2006/0211210 A1 | 9/2006 | Bhat et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2006/0270103 A1* | 11/2006 | Das ............... H01L 29/0873 438/105 |
| 2007/0066039 A1 | 3/2007 | Agarwal et al. |
| 2007/0120148 A1 | 5/2007 | Nogome |
| 2007/0164321 A1 | 7/2007 | Sheppard |
| 2007/0241427 A1 | 10/2007 | Mochizuki et al. |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0105949 A1 | 5/2008 | Zhang et al. |
| 2008/0191304 A1 | 8/2008 | Zhang et al. |
| 2008/0230787 A1 | 9/2008 | Suziki et al. |
| 2008/0251793 A1 | 10/2008 | Mazzola |
| 2008/0277669 A1 | 11/2008 | Okuno et al. |
| 2008/0296771 A1 | 12/2008 | Das et al. |
| 2009/0121319 A1 | 5/2009 | Zhang et al. |
| 2009/0212301 A1 | 8/2009 | Zhang et al. |
| 2009/0289262 A1 | 11/2009 | Zhang et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0244047 A1 | 9/2010 | Hull et al. |

FOREIGN PATENT DOCUMENTS

| | | | |
|---|---|---|---|
| DE | 198 32 329 A1 | 2/1999 | |
| DE | 19900171 | 7/1999 | |
| DE | 10036208 A1 | 2/2002 | |
| EP | 0 176 778 A2 | 4/1986 | |
| EP | 0 372 412 A1 | 6/1990 | |
| EP | 0 389 863 A1 | 10/1990 | |
| EP | 0637069 A1 | 2/1995 | |
| EP | 0735591 A1 | 10/1996 | |
| EP | 0837508 A2 | 4/1998 | |
| EP | 0 865 085 A1 | 9/1998 | |
| EP | 1 058 317 A2 | 12/2000 | |
| EP | 1 361 614 A1 | 11/2003 | |
| EP | 1 460 681 A2 | 9/2004 | |
| EP | 1 503 425 A2 | 2/2005 | |
| EP | 1 693 896 A1 | 8/2006 | |
| EP | 1 806 787 A1 | 7/2007 | |
| EP | 1 845 561 A2 | 10/2007 | |
| EP | 2 015 364 | 1/2009 | |
| JP | 60-240158 | 11/1985 | |
| JP | 64-082565 A | 3/1989 | |
| JP | 01117363 | 5/1989 | |
| JP | 03034466 | 2/1991 | |
| JP | 03157974 | 7/1991 | |
| JP | 3-225870 | 10/1991 | |
| JP | 05-029628 A | 2/1993 | |
| JP | 08264766 | 10/1996 | |
| JP | 09205202 | 8/1997 | |
| JP | 11191559 | 7/1999 | |
| JP | 11238742 A | 8/1999 | |
| JP | 11261061 A | 9/1999 | |
| JP | 11266017 A | 9/1999 | |
| JP | 11274487 | 10/1999 | |
| JP | 2000-012846 | 1/2000 | |
| JP | 2000049167 | 2/2000 | |
| JP | 2000082812 A | 3/2000 | |
| JP | 2000-252478 A | 9/2000 | |
| JP | 02000252461 A | 9/2000 | |
| JP | 2001-068428 A | 3/2001 | |
| JP | 2000106371 A | 4/2001 | |
| JP | 2002-110985 A | 4/2002 | |
| JP | 2002-314099 | 10/2002 | |
| JP | 2003-298052 A | 10/2003 | |
| JP | 2003-318409 A | 11/2003 | |
| JP | EP 1361614 A1 * | 11/2003 | ........... H01L 21/049 |
| JP | 2004-221263 A | 8/2004 | |
| JP | 2005-033030 A | 2/2005 | |
| JP | 2005-353771 A | 12/2005 | |
| JP | 2006-086549 A | 3/2006 | |
| WO | WO 96/03774 | 2/1996 | |
| WO | WO 97/08754 | 3/1997 | |
| WO | WO 97/17730 | 5/1997 | |
| WO | WO 97/39485 A1 | 10/1997 | |
| WO | WO 98/02916 | 1/1998 | |
| WO | WO 98/02924 A2 | 1/1998 | |
| WO | WO 98/08259 | 2/1998 | |
| WO | WO 98/32178 | 7/1998 | |
| WO | WO99/63591 A1 | 12/1999 | |
| WO | WO 00/13236 A3 | 3/2000 | |
| WO | WO 01/78134 A1 | 10/2001 | |
| WO | WO 2004/020706 A1 | 3/2004 | |
| WO | WO 2004/079789 A2 | 9/2004 | |
| WO | WO 2005/020308 A1 | 3/2005 | |

(56) References Cited

FOREIGN PATENT DOCUMENTS

WO    WO 2006/135031 A2    12/2006
WO    WO 2007/040710 A1    4/2007

OTHER PUBLICATIONS

Office Action (Notice of Preliminary Rejection) for corresponding Korean Patent Application No. 10-2009-7005341, mailed Sep. 25, 2014 (3 pages).
Examination Report for corresponding European Application No. 07809621.1, mailed Sep. 4, 2014 (5 pages).
Vassilevski et al. "Protection of Selectively Implanted and Patterned Silicon Carbide Surfaces with Graphite Capping Layer During Post-Implantation Annealing" *Semicond. Sci. Technol.* 20:271-278 (2005).
"Insulated-gate bipolar transistor." *Wikipedia, the Free Encyclopedia.* Web. Jun. 21, 2010. http://en.wikipedia.org.
A.K. Agarwal, J.B. Casady, L.B. Rowland, W.F. Valek, and C.D. Brandt, "1400 V 4H-SiC Power MOSFET's," Materials Science Forum vols. 264-268, pp. 989-992, 1998.
A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.
A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.
A.K. Agarwal, S. Seshadri, and L.B. Rowland, "Temperature Dependence of Fowler-Nordheim Current in 6H-and 4H-SiC MOS Capacitors," *IEEE Electron Device Letters*, vol. 18, No. 12, Dec. 1997, pp. 592-594.
A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.
Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.
Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.
Ayalew, T, "Dissertation of Tesfaye Ayalew", Section 4.4.3.1 MPS Diode Structure, *SiC Semiconductor Devices Technology, Modeling, and Simulation*, 2006.
Baliga "Insulated Gate Biopolar Transistor" *Power Semiconductor Devices.* PWS Publishing Company, Boston, MA. 426-502 (1996).
Baliga "Power MOSFET" *Power Semiconductor Devices.* PWS Publishing Company, Boston, MA 335-425 (1996).
Baliga, Power Semiconductor Devices, Chapter 7, PWS Publishing, 1996.
Bhatnagar et al. "Comparison of 6H-SiC, 3C-SiC, and Si for Power Devices," *IEEE Transactions on Electron Devices*, vol. 40, No. 3, Mar. 1993, pp. 645-655.
Buchner et al., "Laser Recrystallization of Polysilicon for Improved Device Quality", Springer Proceedings in Physics, vol. 35, Polycrystalline Semiconductors, pp. 289-294.
Capano, M.A., et al., Ionization Energies and Electron Mobilities in Phosphorus--and Nitrogen-Implanted 4H-Silicon Carbide, IEEE ICSCRM Conference 1999, Research Triangle Park, North Carolina (Oct. 10-13, 1999).
Chakraborty et al. "Interface Properties of $N_2O$-annealed $SiO_2$/SiC system," *Proceedings IEEE Hong Kong Electron Devices Meeting.* Jun. 24, 2000, pp. 108-111.
Chang et al. "Observation of a Non-stoichiometric Layer at the Silicon Dioxide--Silicon Carbide Interface: Effect of Oxidation Temperature and Post-Oxidation Processing Conditions," *Mat. Res. Soc. Symp. Proc.* vol. 640, 2001.
Chen et al. "Theoretical Analysis of Current Crowding Effect in Metal/AlGaN/GaN Schottky Diodes and Its Reduction by Using Polysilicon in Anode," Chin. Phys. Lett., vol. 24, No. 7 (2007) pp. 2112-2114.
Chinese Office Action dated Jan. 22, 2010, corresponding to Chinese Patent Application No. 200780029460.5, 7 pages.
Cho et al. "Improvement of charge trapping by hydrogen post-oxidation annealing in gate oxide of 4H-SiC methel-oxide-semiconductor capacitors," *Applied Physics Letters.* vol. 77, No. 8, pp. 1215-1217 (Aug. 21, 2000).
Chung et al. "Effects of anneals in ammonia on the interface trap density near athe band edges in 4H-silicon carbide metal-oxide-semiconductor capacitors," *Applied Physics Letters.* vol. 77, Nov. 27, 2000, pp. 3601-3603.
Chung et al., "The Effect of Si:C Source Ratio on $SiO_2$/SiC Interface State Density for Nitrogen Doped 4H and 6H-SiC," *Materials Science Forum.* (2000) vols. 338-342, pp. 1097-1100.
International Search Report and Written Opinion for corresponding International Application No. PCT/US2004/004982, dated Jul. 22, 2004.
International Search Report for PCT/US01/30715.
International Search Report for PCT/US01/42414, dated Apr. 23, 2002.
International Search Report for PCT/US02/11691 dated Dec. 4, 2002.
D. Alok, E. Arnold, and R. Egloff, "Process Dependence of Inversion Layer Mobility in 4H-SiC Devices," *Materials Science Forum*, vols. 338-342, pp. 1077-1080, 2000.
Dahlquist et al. "A 2.8kV, Forward Drop JBS Diode with Low Leakage," *Materials Science Forum*, vols. 338-342, (2000) pp. 1179-1182.
Das, Mrinal K. Graduate thesis entitled, *Fundamental Studies of the Silicon Carbide MOS Structure.* Purdue University, 1999.
Dastidar, Sujoyita, A Study of P-Type Activation in Silicon Carbide, Thesis (Purdue University, May 1998).
De Meo et al., "Thermal Oxidation of SiC in $N_2O$", *J. Electrochem. Soc.*, vol. 141, 1994, pp. L150-L152.
del Prado et al. "Full Composition Range Silicon Oxynitride Films Deposited by ECR-PECVD at Room Temperatures," *Thin Solid Films.* vol. 343-344 (1999) p. 437-440.
Dimitrijev et al., "Nitridation of Silicon-Dioxide Films Grown on 6H Silicon Carbide", *IEEE Electronic Device Letters*, vol. 18, No. 5, May 5, 1997, pp. 175-177.
European Search Report for corresponding EP patent application No. 09177558.5 dated Feb. 22, 2010.
European Search Report for corresponding EP patent application No. 09163424.6 dated Apr. 9, 2010.
European Search Report; Application No. EP07120038; Jun. 16, 2008.
Extended European Search Report (12 pages) corresponding to European Application No. 07112298; Dated Feb. 18, 2009.
Fisher, C.A. et al., "The performance of high-voltage field relieved Schottky barrier diodes", IEE Proceedings, vol. 132:6, Pt. I, pp. 257-260 (Dec. 1985).
Fukuda et al. "Improvement of $SiO_2$/4H-SiC Interface Using High-Temperature Hydrogen Annealing at Low Pressure and Vacuum Annealing," *Jpn. J. Appl. Phys.* vol. 38, Apr. 1999, pp. 2306-2309.
Fukuda et al. "Improvement of $SiO_2$/4H-SiC Interface Using High-Temperature Hydrogen Annealing at 1000° C.," *Extended Abstracts of the International Conference on Solid State Devices and Materials.* Japan Society of Applied Physics, Tokyo, Japan, Sep. 1998.
G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.
G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

(56) References Cited

OTHER PUBLICATIONS

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.
http://www.elec.gla.ac.uk; *The Insulated Gate Bipolar Transistor (IGBT)*; Feb. 14, 2007.
Hubel, K, "Hybrid design improves diode robustness and boosts efficiency," Compoundsemiconductor.net, 2006.
Hull et al., "Drift-Free 10-kV, 20-A 4H-SiC PiN Diodes," Journal of Electronic Materials, vol. 34, No. 4, 2005, pp. 341-344.
International Preliminary Report on Patentability (9 pages) corresponding to International Application No. PCT/US2007/010192; Mailing Date: Sep. 23, 2008.
International Search Report and Written Opinion (13 pages) corresponding to International Application No. PCT/US2008/010538; Mailing Date: Dec. 22, 2008.
International Search Report and Written Opinion (14 pages) corresponding to International Application No. PCT/US2010/020071; Mailing Date: Mar. 26, 2010.
International Search Report and Written Opinion (14 pages) corresponding to International Application No. PCT/US2009/065251; Mailing Date: Jun. 1, 2010.
International Search Report and Written Opinion (16 pages) corresponding to International Application No. PCT/US2009/003089; Mailing Date: Aug. 20, 2009.
International Search Report and Written Opinion for PCT/US2010/025053 mailed on Jul. 2, 2010.
International Search Report and Written Opinion, International Application No. PCT/US2009/000734, Apr. 23, 2009.
International Search Report, PCT/US2008/008574, Sep. 26, 2008.
Invitation to Pay Additional Fees for PCT/US2007/010192; Oct. 29, 2007.
Invitation to Pay Additional Fees for PCT/US2010/025053 mailed on May 3, 2010.
J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.
J.B. Casady, A.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.
J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.
J.T. Richmond, S. Ryu, A.K. Agarwal and J.W. Palmour, "Hybrid 4H-SiC MOS Gated Transistor (MGT)".
Jamet, et al. "Physical properties of $N_2O$ and NO-nitrided gate oxides grown on 4H SiC," *Applied Physics Letters*. vol. 79, No. 3, Jul. 16, 2001, pp. 323-325.
K. Ueno and Tadaaki Oikawa, "Counter-Doped MOSFET's of 4H-SiC," *IEEE Electron Device Letters*, vol. 20, No. 12, pp. 624-626, Dec. 1999.
K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.
Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.
Kinoshita et al., "Guard Ring Assisted RESURF: A New Termination Structure Providing Stable and High Breakdown Voltage for SiC Power Devices," Tech. Digest of ISPSD '02, pp. 253-256.
Kobayashi et al. "Dielectric Breakdown and Current Conduction of Oxide/Nitride/Oxide Multi-Layer Structures," *1990 IEEE Symposium on VLSI Technology*. pp. 119-120.
Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.
Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.
Leonhard et al. "Long term stability of gate-oxides on n- and p-type silicon carbide studied by charge injection techniques," *Materials Science Engineering*, vol. 46, No. 1-3, Apr. 1997, pp. 263-266.
Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.
Lipkin et al. "Insulator Investigation on SiC for Improved Reliability," *IEEE Transactions on Electron Devices*. vol. 46, No. 3, Mar. 1999, pp. 525-532.
Lipkin et al. "Challenges and State-of-the-Art Oxides in SiC," *Mat. Res. Soc. Symp. Proc.* vol. 640, 2001, pp. 27-29.
Losee et al., "Degraded Blocking Performance of 4H-SiC Rectifiers Under High dV/dt Conditions", Proceedings of $17^{th}$ International Symposium on Power Semiconductor Devices & IC's, 4 pages (May 23-26, 2005). XP010820730.
Losee et al., "High-Voltage 4H-SiC PiN Rectifiers with Single-Implant, Multi-Zone JTE Termination", Power Semiconductor Devices and ICs, 2004 Proceedings. ISPSB '04. The $16^{th}$ International Symposium on Kitakyushu Int. Conf. Center, Japan May 24-27, 2004, Piscataway, NJ, USA, IEEE, May 24, 2004, pp. 301-304, XP010723398.
M. Das et al., "A 13 kV 4H-SiC N-Channel IGBT with Low Rdiff, on and Fast Switching" presented at: International Conference on Silicon Carbide and Related Materials )ICSCRM), Otsu, Japan, Oct. 14-19, 2007.
M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.
M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.
M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.
Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.
Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.
Motorola Power MOSFET Transistor Databook, 4th edition. Motorola, INc., 1989, pp. 2-5-4-2-5-7.
Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.
Myer-Ward et al. "Turning of Basal Plane Dislocations During Epitaxial Growth on 4 off-axis 4h-SiC" $7^{th}$ *European Conference on Silicon Carbide and Related Materials*, Barcelona-Spain, Sep. 7-11, 2008 retrieved from http://ecscrm08.com/invited_presentations.html , retrieved Jul. 1, 2009.
Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.
Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

(56) References Cited

OTHER PUBLICATIONS

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.
Notification of Transmittal of the International Search Report and the Written Opinion of the International Searching Authority, or the Declaration, PCT/US2010/028612, Jun. 17, 2010.
Notification of Transmittal of the International Search Report and the Written Opinion of the International Searching Authority, or the Declaration; International Search Report; Written Opinion of the International Searching Authority, PCT/US2008/004239, Mar. 2, 2009.
P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.
P.M. Shenoy and B.J. Baliga, "The Planar 6H-SiC ACCUFET: A New High-Voltage Power MOSFET Structure," *IEEE Electron Device Letters*, vol. 18, No. 12, pp. 589-591, Dec. 1997.
P.T. Lai, Supratic Chakraborty, C.L. Chan, and Y.C. Cheng, "Effects of nitridation and annealing on interface properties of thermally oxidized $SiO_2$/SiC metal-oxide-semiconductor system," *Applied Physics Letters*, vol. 76, No. 25, pp. 3744-3746, Jun. 2000.
Palmour et al. "SiC Device Technology: Remaining Issues," Diamond and Related Materials. vol. 6, 1997, pp. 1400-1404.
Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).
Panknin et al., "Electrical and microstructural properties of highly boron-implantation doped 6H-SiC", Journal of Applied Physics 89:6, pp. 3162-3167 (Mar. 15, 2001).
Pantelides et al., "Atomic-Scale Engineering of the SiC-SiO2 Interface," *Materials Science Forum*. (2000) vols. 338-342, pp. 1133-1136.
Patel, R., et al., Phosphorus-Implanted High-Voltage N.sup.+ P 4H-SiC Junction Rectifiers, Proceedings of 1998 International Symposium on Poer Semiconductor Devices & ICs, pp. 387-390 (Kyoto).
Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.
R. Schörner, P. Friedrichs, D. Peters, and D. Stephani, "Significantly Improved Performance of MOSFETs on Silicon Carbide Using the 15R-SiC Polytype," IEEE Electron Device Letters, vol. 20, No. 5, pp. 241-244, May 1999.
R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.
Ranbir Singh, Sei-Hyung Ryu and John W. Palmour, "High Temperature, High Current, 4H-SiC Accu-DMOSFET," Materials Science Forum vols. 338-342, pp. 1271-1274, 2000.
Rao et al. "Al and N Ion Implantations in 6H-SiC," Silicon Carbide and Related Materials. 1995 Conf, Kyoto, Japan. Published 1996.
Rao et al. "P-N Junction Formation in 6H-SiC by Acceptor Implantation into N-Type Substrate," Nuclear Instruments and Methods in Physics Research B. vol. 106, 1995, pp. 333-338.
Rao et al. "Silane overpressure post-implant annealing of Al dopants in SiC: Cold wall CVD apparatus" *Applied Surface Science* 252: 3837-3842 (2006).
Rao, "Maturing ion-implantation technology and its device applications in SiC", *Solid State Electronics* 47:2, pp. 213-222, Elsevier Science Publishers (Feb. 2003).

Ryu et al. Article and Presentation: "27 $m\Omega\text{-}cm^2$, 1.6 kV Power DiMOSFETs in 4H-SiC," *Proceedings of the 14 International Symposium on Power Semiconductor Devices & ICs* 2002, Jun. 4-7, 2002, Santa Fe, NM.
S. Sridevan and B. Jayant Baliga, "Lateral N-Channel Inversion Mode 4H-SiC MOSFET's," *IEEE Electron Device Letters*, vol. 19, No. 7, pp. 228-230, Jul. 1998.
S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.
S.M. Sze Semiconductor Devices, Physics and Technology. $2^{nd}$ Edition, © 2002 John Wiley and Sons, p. 130.
S.T. Pantelides, "Atomic Scale Engineering of SiC Dielectric Interfaces," DARPA/MTO High Power and ONR Power Switching MURI Reviews, Rosslyn, VA, Aug. 10-12, 1999.
Singh, R. and J.W. Palmour, "Planer Terminations in 4H-SiC Schottky Diodes with Low Leakage and High Yields, "IEEE International Symposium on Power Semiconductor Devices and ICs, 1997, pp. 157-160.
Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.
Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.
Streetman "Bipolar Junction Transistors" *Solid State Electronic Devices*. Prentice Hall, Englewood Cliffs, NJ. 228-284 (1980).
Sugawara et al., "3.6 kV 4H-SiC JBS Diodes with Low RonS". Materials Science Forum, vols. 338-342:2, pp. 1183-1186 (2000). XP-000944901.
Sundaresan et al., "Ultra-low resistivity Al+ implanted 4H-SiC obtained by microwave annealing and a protective graphite cap", *Solid-State Electronics* vol. 52, 2008, pp. 140-145, XP022360431.
Suzuki et al. "Effect of Post-oxidation-annealing in Hydrogen on $SiO_2$/4H-SiC Interface," *Materials Science Forum*, vols. 338-342 (2000) 1073-6.
Sze, S.M. *Physics of Semiconductor Devices*, John Wiley & Sons, p. 383-390, 1981.
Thomas et al., "Annealing of Ion Implantation Damage in SiC Using a Graphite Mask", Material Research Society Symposium Y Proceedings vol. 572, Spring 1999, pp. 45-50.
Treu et al. "A Surge Current Stable and Avalanche Rugged SiC Merged pn Schottky Diode Blocking 600V Especially Suited for PFC Applications" *Materials Science Forum* vols. 527-529: 1155-1158 (2006).
V.R. Vathulya and M.H. White, "Characterization of Channel Mobility on Implanted SiC to Determine Polytype Suitability for the Power DIMOS Structure," *Electronic Materials Conference*, Santa Barbara, CA, Jun. 30-Jul. 2, 1999.
V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.
V.V. Afanasev, M. Bassler, G. Pensl, and M. Schulz, "Intrinsic SiC/$SiO_2$ Interface States," *Phy. Stat. Sol. (a)*, vol. 162, pp. 321-337, 1997.
Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.
Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.
Williams et al. "Passivation of the 4H-SiC/$SiO_2$ Interface with Nitric Oxide," *Materials Science Forum*. vols. 389-393 (2002), pp. 967-972.
Xu et al. "Improved Performance and Reliability of $N_2O$-Grown Oxynitride on 6H-SiH," *IEEE Electron Device Letters*. vol. 21, No. 6, Jun. 2000, p. 298-300.
Y. Li et al., "High Voltage (3 kV) UMOSFETs in 4H-SiC," *Transactions on Electron Devices*, vol. 49, No. 6, Jun. 2002.

(56) References Cited

OTHER PUBLICATIONS

Y. Wang, C. Weitzel, and M. Bhatnagar, "Accumulation-Mode SiC Power MOSFET Design Issues," *Materials Science Forum*, vols. 338-342, pp. 1287-1290.

Zhang et al., "A 10-kV Monolithic Darlington Transistor with βforced of 336 in 4H-SiC," IEEE Electron Device Letters, vol. 30, No. 2, pp. 142-144, XP011240662.

Vassilevski et al., "Protection of selectively implanted and patterned silicon carbide surfaces with graphite capping layer during post-implantation annealing." Institute of Physics Publishing, Semicond. Sci. Technol. 20 (2005) 271-278.

Zhang et al; *Design and Fabrications of High Voltage IGBTs on 4H-SiC*; Power Semiconductor Devices and IC's, 2006 IEEE International Symposium on Naples, Italy; Jun. 4-8, 2006, pp. 1-4.

Senzaki et al; *Effects of Pyrogenic Reoxidation Annealing on Inversion Channel Mobility of 4H-SiC Metal-Oxide-Semiconductor Field-Effect Transistor Fabricated on (1120) Face*; Japanese Journal of Applied Physics, Japan Society of Applied Physics, Tokyo, JP; vol. 40, No. 11B, Part 2; Nov. 2001, pp. L1201-L1203.

International Search Report and Written Opinion for PCT/US2007/014139; Feb. 4, 2008.

Yilmaz, "Optimization and Surface Charge Sensitivity of High Voltage Blocking Structures with Shallow Junction, "IEEE Transactions on Electron Devices, vol. 38, No. 3, Jul. 1991, pp. 1666-1675.

Japanese Office Action corresponding to Japanese Patent Application No. 2009-524593; Mailing Date: Nov. 20, 2012; 10 pages, English Translation.

Japanese Office Action corresponding to Japanese Patent Application No. 2009-524593; Mailing Date: Mar. 12, 2013; 3 pages, (Foreign text only).

Korean Office Action corresponding to Korean Patent Application No. 10-2009-7005341; Mailing Date: Jul. 11, 2013; Foreign Text—5 pages; English Translation Thereof—4 pages.

European Search Report corresponding to European Application No. 13169099.2; dated: Aug. 5, 2013, 7 pages.

\* cited by examiner

HIGH POWER INSULATED GATE BIPOLAR TRANSISTORS

CROSS-REFERENCE TO RELATED APPLICATION AND CLAIM OF PRIORITY

This application is a divisional of and claims priority to U.S. patent application Ser. No. 11/764,492, filed Jun. 18, 2007, entitled "High Power Insulated Gate Bipolar Transistors," which claims the benefit of and priority to U.S. Provisional Patent Application No. 60/838,249, filed Aug. 17, 2006, entitled "High Power Insulated Gate Bipolar Transistors," the disclosures of which are hereby incorporated herein by reference in their entirety.

STATEMENT OF U.S. GOVERNMENT INTEREST

This invention was made with Government support under Contract No. N00014-05-C-0202 awarded by ONR/DARPA. The Government has certain rights in the invention.

BACKGROUND

The present invention relates to electronic devices. More particularly, the present invention relates to high power insulated gate bipolar transistors.

Power devices made with silicon carbide (SiC) are expected to show great advantages as compared to those on silicon for high speed, high power and/or high temperature applications due to the high critical field and wide band gap of SiC. For devices capable of blocking high voltages, such as voltages in excess of about 5 kV, it may be desirable to have bipolar operation to reduce the drift layer resistance via conductivity modulation resulting from injected minority carriers. However, one technical challenge for bipolar devices in silicon carbide is forward voltage degradation over time, possibly due to the presence of Basal Plane Dislocations (BPD) in single crystals of silicon carbide. Thus, unipolar devices such as SiC Schottky diodes and MOSFETs are typically used for high power applications.

SiC DMOSFET devices with a 10 kV blocking capability have been fabricated with a specific on-resistance of about 100 mΩ×cm$^2$. DMOSFET devices may exhibit very fast switching speed of, for example, less than 100 ns, due to their majority carrier nature. However, as the desired blocking voltage of devices increases, for example up to 15 kV or more, the on-resistance of a MOSFET device may increase substantially, due to the corresponding increase in the drift layer thickness. This problem may be exacerbated at high temperatures due to bulk mobility reduction, which may result in excessive power dissipation.

With the progress of SiC crystal material growth, several approaches have been developed to mitigate BPD related problems. See, e.g., B. Hull, M. Das, J. Sumakeris, J. Richmond, and S. Krishinaswami, "Drift-Free 10-kV, 20-A 4 H-SiC PiN Diodes", Journal of Electrical Materials, Vol. 34, No. 4, 2005. These developments may enhance the development and/or potential applications of SiC bipolar devices such as thyristors, GTOs, etc. Even though thyristors and/or GTOs may offer low forward voltage drops, they may require bulky commutating circuits for the gate drive and protections. Accordingly, it may be desirable for a SiC bipolar device to have gate turn-off capability. Due to their superior on-state characteristics, reasonable switching speed, and/or excellent safe-operation-area (SOA), 4 H-SiC insulated gate bipolar transistors (IGBTs) are becoming more suitable for power switching applications.

SUMMARY

A silicon carbide-based insulated gate bipolar transistor (IGBT) according to some embodiments includes a silicon carbide substrate having a first conductivity type, a silicon carbide drift layer having a second conductivity type opposite the first conductivity type, and a well region in the drift layer and having the first conductivity type. A silicon carbide epitaxial channel adjustment layer is on the drift layer and has the second conductivity type. An emitter region extends from a surface of the epitaxial channel adjustment layer through the epitaxial channel adjustment layer and into the well region. The emitter region has the second conductivity type and at least partially defines a channel region in the well region adjacent to the emitter region. A gate oxide layer is on the channel region, and a gate is on the gate oxide layer.

The silicon carbide drift layer may include a JFET region adjacent to the well region. The emitter region may be spaced apart from the JFET region and may define the channel region between the emitter region and the JFET region.

In some embodiments, the first conductivity type may be n-type and the second conductivity type may be p-type.

The transistor may further include a connector region of the first conductivity type extending from a surface of the channel adjustment layer into the well region, a first ohmic contact on the connector region, a second ohmic contact on the emitter region and including a material different from the first ohmic contact, and a metal overlayer electrically connecting the first ohmic contact and the second ohmic contact.

The first ohmic contact may include a nickel-based conductive material and the second ohmic contact may include an aluminum-based conductive material.

The channel adjustment layer may have a thickness of about 0.25 μm or more. Furthermore, the distance from a bottom of the emitter region to a bottom of the well region is about 0.45 μm or more.

The channel adjustment layer may have a thickness of about 0.1 μm to about 0.5 μm, and a net doping concentration of about $1 \times 10^{16}$ cm$^{-3}$ to about $5 \times 10^{18}$ cm$^{-3}$.

Some embodiments of the invention provide methods of forming an insulated gate bipolar transistor (IGBT) device in silicon carbide. The methods include forming a p-type silicon carbide drift layer on an n-type silicon carbide substrate, forming an n-type well in the p-type silicon carbide drift layer, and epitaxially growing a p-type channel adjustment layer on the p-type silicon carbide drift layer and on the n-type well. P-type dopant ions may be implanted to form a p-type emitter region extending through the channel layer and into the n-type well at a surface of the silicon carbide layer. The p-type emitter region at least partially defines a channel region in the n-type well adjacent the p-type emitter region. The methods further include implanting n-type dopant ions to form an n-type connector region extending through the channel layer and into the n-type well at a surface of the silicon carbide layer. The implanted ions are annealed. A gate oxide layer is formed on the channel region, and a gate is formed on the gate oxide layer.

The methods may further include forming a graphite coating for implant activation and removing the graphite coating after annealing the implanted ions. Annealing the implanted ions may include annealing the silicon carbide layer and the graphite coating. The methods may further include crystallizing the graphite coating before annealing the implanted ions.

Annealing the implanted ions may include annealing the implanted ions at a temperature greater than 1700° C., and in some embodiments greater than 1800° C. Forming the gate oxide layer may include forming the gate oxide layer in dry $O_2$, the method may further include annealing the gate oxide layer in wet $O_2$. In particular, forming the gate oxide layer may include forming the gate oxide layer in dry $O_2$ at a temperature less than or equal to about 1200° C.

The methods may further include annealing the gate oxide layer in an inert atmosphere at a temperature less than or equal to about 1200° C. after forming the gate oxide layer and before annealing the gate oxide layer in wet $O_2$.

Annealing the gate oxide layer in wet $O_2$ may include annealing the gate oxide layer in wet $O_2$ at a temperature less than or equal to about 950° C. for at least one hour.

Annealing the oxide layer in wet $O_2$ may include generating pyrogenic steam in a pyrogenic chamber, supplying the pyrogenic steam to an anneal chamber, and annealing the oxide layer in the anneal chamber. Generating pyrogenic steam may include heating the pyrogenic chamber, supplying hydrogen and oxygen gas to the pyrogenic chamber, and combusting the hydrogen gas and the oxygen gas to form the pyrogenic steam, the hydrogen gas and the oxygen gas are supplied to the pyrogenic chamber at a molecular ratio of hydrogen to oxygen of about 1.8 or more.

The methods may further include implanting p-type dopant ions into the drift layer to form a JFET region adjacent to the n-type well. The p-type emitter region may be spaced apart from the JFET region and may define a channel region between the p-type emitter region and the JFET region.

The channel adjustment layer may have a thickness of about 0.1 μm to about 0.5 μm, and a net acceptor concentration of about $1 \times 10^{16}$ cm$^{-3}$ to about $5 \times 10^{18}$ cm$^{-3}$.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Some embodiments of the invention provide insulated gate bipolar transistors (IGBTs) that are suitable for high power and/or high temperature applications. Some embodiments of the invention provide high voltage planar IGBTs. Although embodiments of the invention described herein include silicon carbide substrates and epitaxial layers, the principles and structures described herein may be advantageously employed in devices formed using other materials, such as silicon, germanium, gallium arsenide, and gallium nitride, and alloys thereof.

The first reported planar gate 5.8 kV IGBT in SiC was built on an n-type substrate in 2005. See, Q. Zhang, C. Jonas, S. Ryu, A. Agarwal and J. Palmour "Design and Fabrications of High Voltage IGBTs on 4 H-SiC", ISPSD Proceeding, 2006. The p-channel IGBT was selected due to the lack of high quality, low resistivity p-SiC substrates, which are required for n-channel IGBTs. The device exhibits a differential on-resistance (Rdiff, on) of about 570 mΩ×cm$^2$ at a gate bias of −30 V at 25° C., and decreases to about 118 mΩ×cm$^2$ at 200° C., respectively. The high on-resistance was primarily attributed to the low bulk carrier lifetimes, and low hole channel mobility.

Figure 1:
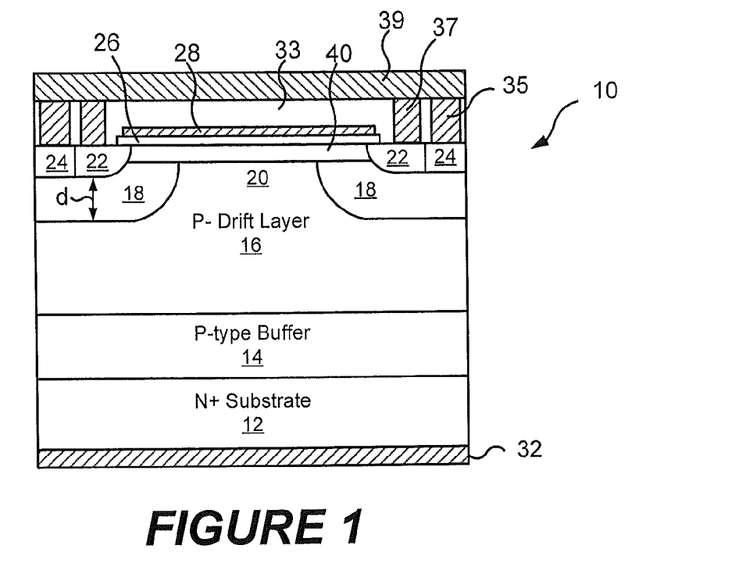
FIG. 1 is a cross-section of a silicon carbide insulated gate bipolar transistor (IGBT) device according to some embodiments of the invention.

An IGBT structure according to some embodiments of the invention is shown in FIG. 1. A planar device structure, such as the structure of the device 10 shown in FIG. 1, may provide process simplification and/or enhanced device reliability. However, other device structures may be advantageously employed.

The device 10 of FIG. 1 includes a p-type buffer layer 14 and a p− drift epitaxial layer 16 on an n-type substrate 12. The substrate 12 may include an n+-type, 8° off-axis 4 H-SiC substrate. The p− drift layer 16 may have a thickness of about 110 μm and may be doped with p-type dopants at a doping concentration selected to provide a desired blocking voltage. For example, the p− drift layer 16 may be doped with p-type dopants at a doping concentration of about $2×10^{14}$ cm$^{-3}$ to about $6×10^{14}$ cm$^{-3}$ for a 10 kV blocking capability. The p-type buffer layer 14 may have a thickness of about 1 μm to about 2 μm and may be doped with p-type dopants at a doping concentration of about $1×10^{17}$ cm$^{-3}$. The p-type buffer layer 14 is provided as a channel stop layer to discourage punch-through.

N+ well regions 18 are formed at a surface of the p-type drift layer 16. The n+ well regions 18, which may be formed by ion implantation, may extend a distance of about 0.5 μm into the drift layer 16.

An epitaxial p-type channel adjustment layer 40 is on the drift layer 16. The channel adjustment layer 40 may have a thickness of about 0.1 μm to about 0.5 μm, and may be doped with p-type dopants to have a net acceptor concentration of about $1×10^{16}$ cm$^{-3}$ to about $5×10^{18}$ cm$^{-3}$. In particular, the epitaxial p-type channel adjustment layer 40 may have a thickness of about 0.25 μm and may be doped with acceptor ions, such as aluminum ions, at a doping concentration of about $1×10^{17}$ cm$^{-2}$. The presence of the p-type channel adjustment layer 40 may modify the threshold voltage and/or improve the inversion channel mobility of the device 10.

The device 10 further includes n+ connector regions 24 and p+ emitter regions 22 that may be formed by selective implantation of, for example, nitrogen and aluminum, respectively. The n+ connector regions 24 and p+ emitter regions 22 extend through the p-type channel adjustment layer 40 and into the n+ well regions 18. In some embodiments, a distance d between the bottom of the p+ emitter regions 22 and the bottom of the n+ well regions 18 may be about 0.45 μm or more. An increased distance d may provide a lower resistance of the n+ well regions 18, which may result in improved on-state resistance of the device 10.

A guard-ring based edge termination (not shown) may be provided around the device periphery. Other types of edge terminations may be used.

The device 10 includes a JFET region 20 in the drift layer 16 between adjacent n+ well regions 18. The JFET region 20 may be implanted with p-type dopants to reduce the JFET resistance from the adjacent n+ well regions 18. In some embodiments, the JFET region 20 may be formed by an epitaxial growth process.

The device 10 further includes a gate insulation layer 26, which may include silicon dioxide having a thickness of about 400-1000 Å.

A gate 28 of, for example, polysilicon is formed on the gate insulation layer 26. An interlayer dielectric layer 33 is on the surface of the device 10 and electrically insulates the gate 28.

N-type ohmic contacts 35 are formed to the n+ connector regions 24, and p-type ohmic contacts 37 are formed to the p+ emitter regions 22. The n-type ohmic contacts 35 may include a nickel-based conductive layer, such as Ni and/or NiSi. The p-type ohmic contact 37 may include an aluminum-based conductive layer, such as Al and/or AlSi. A metal overlayer 39 is formed on the interlayer dielectric layer 33 and electrically connects the n-type connector regions 24 and the p-type emitter regions 22 through their respective ohmic contacts 35, 37. An n-type ohmic metal collector contact 32 is formed on the substrate 12.

Figure 2A:
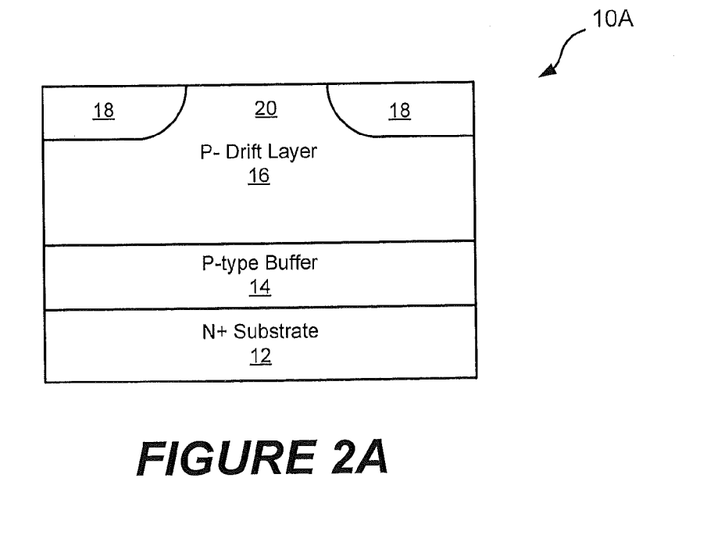
FIGS. 2A to 2D are cross-section illustrations showing intermediate structures in the formation of an IGBT device according to some embodiments of the invention.

FIGS. 2A to 2D illustrate some operations that may be performed and intermediate structures 10A to 10D that may be formed during the formation of a device 10. Referring to FIG. 2A, a p-type SiC buffer 14 and a p− SiC drift layer 16 are formed by epitaxial growth on an n+-type 8° off-axis 4 H-SiC substrate 12. The p-type buffer layer 14 may have a thickness of about 1 μm to about 2 μm and may be doped with p-type dopants at a doping concentration of about $1×10^{17}$ cm$^{-3}$. After formation of the p-type drift layer 16, the n+ well regions 18 are formed, for example, by implantation of donor ions, such as nitrogen, into the drift layer 16. It may be desirable to implant the n+ well regions 18 as deep as possible. The depth of the n+ well regions 18 may be limited by the available implant energy.

The structure may then be annealed at a temperature of about 1600° C. or more to activate the implanted ions. In particular, the structure may be annealed under standard SiC activation annealing conditions that are known in the art to activate the n-type dopants.

The JFET region 20 may be formed, for example, by implantation of aluminum in the drift layer 16 between adjacent n+ well regions 18. The JFET region 20 may be implanted with p-type dopants to reduce the JFET resistance from the adjacent n+ well regions 18. In particular, the JFET implantation dose may be selected to reduce the JFET resistance while keeping implant damage at an acceptable level. In some embodiments, the JFET implantation may be performed at a dose sufficient to provide a dopant concentration of about $1 \times 10^{16}$ cm$^{-3}$ in the JFET region 20. The JFET region may, in some embodiments, be formed by an epitaxial growth process.

Figure 2B:
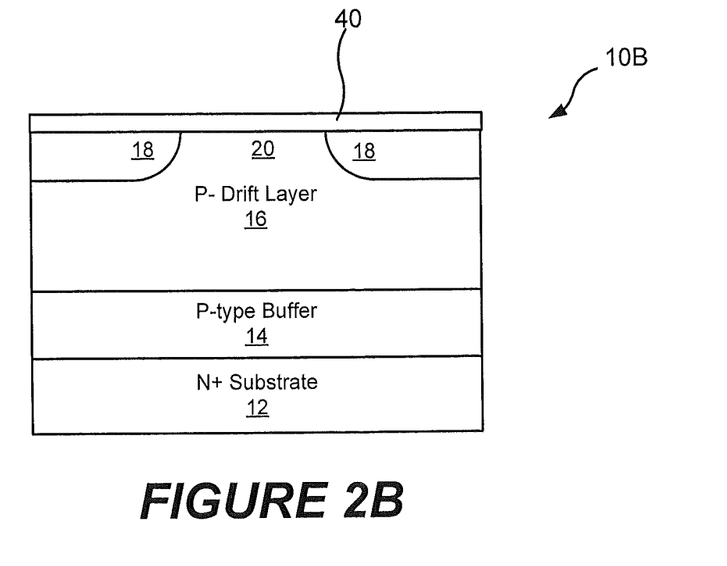

Referring to FIG. 2B, an epitaxial channel adjustment layer 40 is formed on the drift layer 16, for example using well-known SiC epitaxial regrowth techniques. The channel adjustment layer 40 may be doped with acceptor ions at a doping concentration of about $1 \times 10^{17}$ cm$^{-3}$.

The epitaxial channel adjustment layer 40 may modify the threshold voltage and/or improve the inversion channel mobility of the device. Furthermore, the channel adjustment layer 40 may also permit formation of shallower p-type source regions 22 relative to the n-type well regions 18. Providing deeper n-type well regions 18 by lifting the p-type emitter implants 22 to the surface of the regrown channel adjustment layer 40 may reduce or prevent latch-up in the device. The deep n+ well 18 may result in a lower N-well resistance due to the increased spacing d between the bottom of the p-type emitter region 22 and the bottom of the n+ well 18. A lower n-well resistance may increase the device latch-up current and/or provide a better on-state resistance.

Figure 2C:
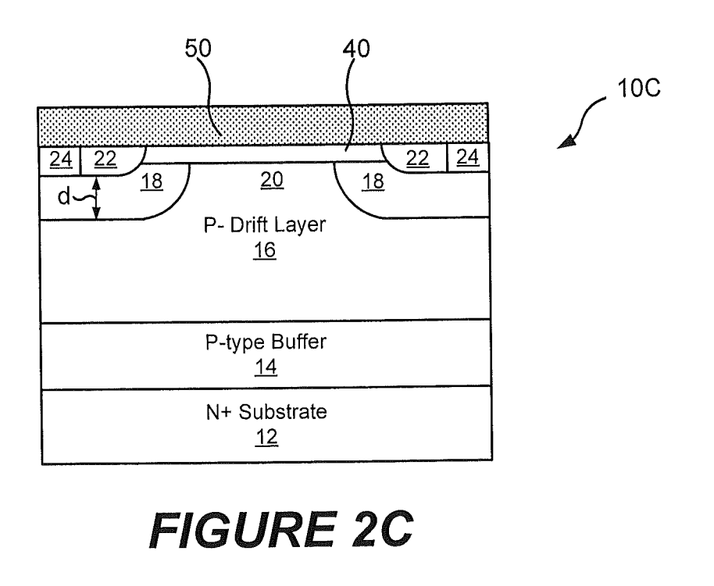

Referring to FIG. 2C, the n-type connector regions 24 and p-type emitter regions 22 are formed, for example, by selective implantation of donor and acceptor ions, respectively, into/through the epitaxial channel adjustment layer 40.

It will be appreciated that the distance d shown in FIG. 2C is a function of the vertical extent of the n-type well regions 18 and the vertical extent of the p-type emitter regions 22. In general, it may be desirable to make the spacing d between the bottom of the p-type emitter regions 22 and the bottom of the n+ well 18 regions as large as possible. Furthermore, as described above, the p-type emitter regions 22 may be formed after formation of the p-type epitaxial channel adjustment layer 40. Thus, the thickness (depth) of the well regions 18 is determined by the maximum implant energy of the system used to manufacture the device. However, the penetration depth of the p+ emitter regions 22 into the n-type well regions 18 may be decreased by the thickness of the epitaxial channel adjustment layer 40, which may be about 0.25 µ.

Still referring to FIG. 2C, the implanted dopants may be activated by annealing the structure at a temperature of about 1600° C. or more with a silicon over pressure and/or covered by an encapsulation layer such as a graphite film. In some embodiments, the implants may be activated by annealing at a temperature greater than about 1700° C. using a graphite encapsulation layer.

A high temperature activation anneal (e.g. 1700° C. or more) may enhance the activation of the threshold adjustment ions, as well as annealing of defects in the channel region 40. However, such a high temperature anneal may damage the surface of the silicon carbide drift layer 16.

Referring to FIG. 2C, in order to reduce damage that may result from a high temperature anneal, a graphite coating 50 may be formed on the surface of the structure 10C prior to formation of the gate oxide 26, gate contact 28 and emitter contact 30. That is, prior to annealing the structure 10C to activate the implanted ions, a graphite coating 50 may be applied to the top/front side of the structure 10C in order to protect the surface of the structure during the anneal. The graphite coating 50 may be applied by a conventional resist coating method and may have a thickness that is sufficient to protect the underlying SiC layers during a high temperature anneal. For example, the graphite coating 50 may have a thickness of about 1 µm. The graphite coating 50 may be heated to form a crystalline coating on the channel adjustment layer 40. The implanted ions may be activated by a thermal anneal that may be performed, for example, in an inert gas at a temperature of about 1700° C. or greater. In particular the thermal anneal may be performed at a temperature of about 1850° C. in argon for 5 minutes. The graphite coating 50 may help to protect the surface of the epitaxial channel adjustment layer 40 and/or the drift layer 16 during the high temperature anneal.

The graphite coating 50 may then be removed, for example, by ashing and thermal oxidation.

After implant annealing, a field oxide (not shown) of, for example, silicon dioxide having a thickness of about 1 µm may be deposited and patterned to expose the active region of the device.

Figure 2D:
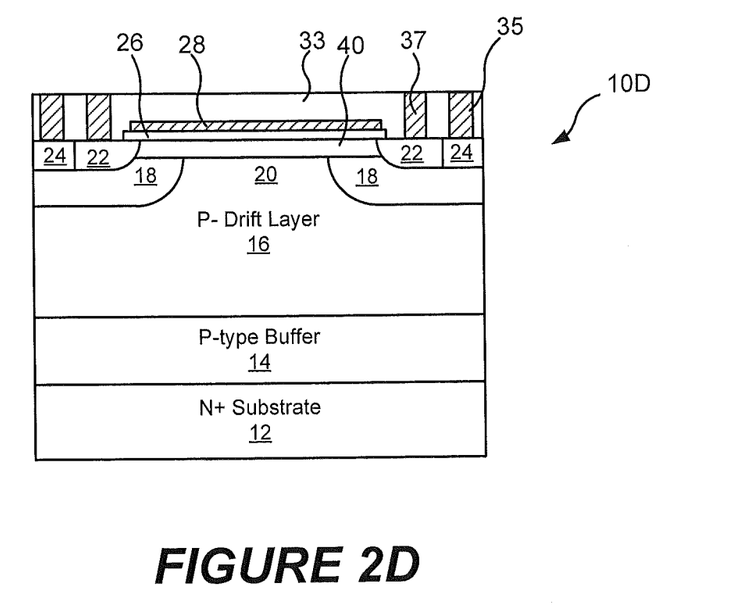

Referring to FIG. 2D, the gate insulation layer 26 may be formed by a gate oxidation process, with a final gate oxide thickness of 400-600Å.

The gate insulation layer 26 may be grown on the exposed surface of the drift layer 16 after removal of the graphite cap layer 50. The gate insulation layer 26 may include an oxide layer grown by a dry-wet oxidation process that includes a growth of bulk oxide in dry $O_2$ followed by an anneal of the bulk oxide in wet $O_2$ as described, for example, in U.S. Pat. No. 5,972,801, the disclosure of which is incorporated herein by reference in its entirety. As used herein, anneal of oxide in wet $O_2$ refers to anneal of an oxide in an ambient containing both $O_2$ and vaporized $H_2O$. An anneal may be performed in between the dry oxide growth and the wet oxide growth. The dry $O_2$ oxide growth may be performed, for example, in a quartz furnace tube at a temperature of up to about 1200° C. in dry $O_2$ for a time of at least about 2.5 hours. Dry oxide growth is performed to grow the bulk oxide layer to a desired thickness. The temperature of the dry oxide growth may affect the oxide growth rate. For example, higher process temperatures may produce higher oxide growth rates. The maximum growth temperature may be dependent on the system used. Higher temperatures may be achieved for the dry $O_2$ growth by using, for example, a silicon carbide furnace instead of a quartz tube. However, higher temperatures may not improve the quality of the oxide.

In some embodiments, the dry $O_2$ oxide growth may be performed at a temperature of about 1175° C. in dry $O_2$ for about 3.5 hours. The resulting oxide layer may be annealed at a temperature of up to about 1200° C. in an inert atmosphere. In particular, the resulting oxide layer may be annealed at a temperature of about 1175° C. in Ar for about 1 hour.

The wet $O_2$ oxide anneal may be performed at a temperature of about 950° C. or less for a time of at least about 1 hour. The temperature of the wet $O_2$ anneal may be limited to discourage further thermal oxide growth at the $SiC/SiO_2$ interface, which may introduce additional interface states. In particular, the wet $O_2$ anneal may be performed in wet $O_2$ at a temperature of about 950° C. for about 3 hours, The resulting gate insulation layer 26 may have a thickness of about 500 Å.

Figure 3:
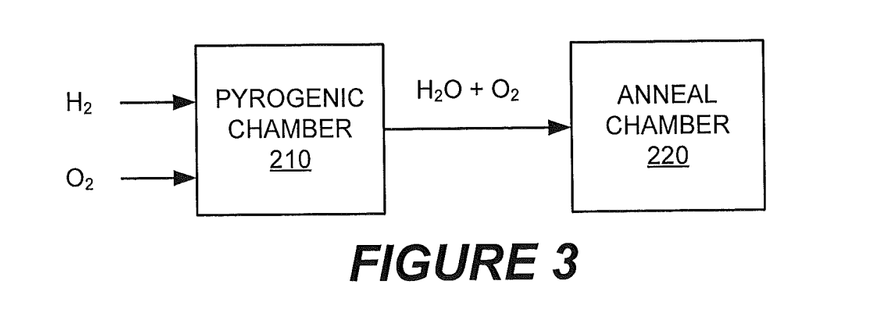
FIG. 3 is a schematic diagram illustrating a pyrogenic chamber and an anneal chamber that may be used according to some embodiments of the invention.

In some embodiments, the steam used in the wet $O_2$ anneal process may be generated using a pyrogenic process, and the resulting wet $O_2$ anneal may be referred to as a "pyrogenic oxidation." Referring to FIG. 3, in a pyrogenic oxidation, oxygen ($O_2$) gas and hydrogen ($H_2$) gas are flowed into a pyrogenic chamber 210, which is separate from the anneal chamber 220, and which is heated to a high temperature, such as about 800° C. The hydrogen and oxygen gas combust in the pyrogenic chamber 210 and form a mixture of steam ($H_2O$) and oxygen ($O_2$), which is supplied to the anneal chamber 220.

In some cases, it may be desirable to adjust the flow rates of hydrogen and oxygen into the pyrogenic chamber 210 so that a molecular ratio of hydrogen to oxygen approaches, but does not exceed, a 2:1 ratio. That is, it may be desirable for the mixture supplied to the anneal chamber 220 to be as wet as possible, within reasonable safety limits. In some cases, a hydrogen/oxygen ratio of 1.8:1 or 1.9:1 may be used.

Referring again to FIG. 2D, after formation of the gate insulation layer 26, a polysilicon gate 28 may be deposited and doped, for example, with boron followed by a metallization process to reduce the gate resistance. An interlayer dielectric layer 33, for example of silicon dioxide, is formed on the structure 10D and covers the gate 28 and exposed portions of the structure 10D. Via holes are opened in the interlayer dielectric layer 33, and ohmic contacts are formed to the p-type emitter regions 22 and the n-type connector regions 24. An Al-based conductive material, such as Al and/or AlSi, may be deposited as the p-type ohmic metal emitter contacts 37, and a Ni-based conductive layer such as Ni and/or Ni/Si may be deposited as the n-type ohmic metal contacts 35. All contacts may be sintered in Rapid Thermal Annealer. As shown in FIG. 1, a metal overlayer 39, such as a thick Ti/Au layer, may be deposited on the interlayer dielectric layer to electrically connect the p-type emitter regions 22 and the n-type connector regions 24. An n-type collector contact 32 is formed as a backside contact on the device 10.

Figure 4:
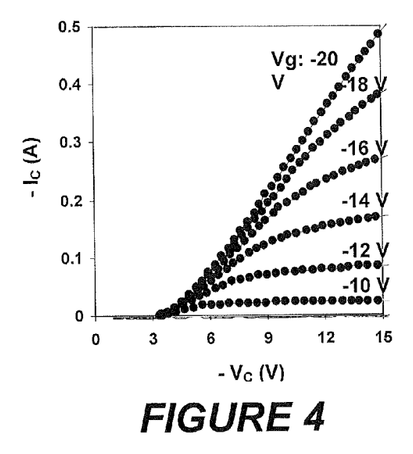
FIGS. 4-5 are plots of on-state I-V characteristics for an IGBT device according to some embodiments of the invention.

A planar IGBT as described above and having an active area of 0.4 $mm^2$ was fabricated and characterized for on-state and blocking characteristics with negative potentials on the gate and collector. The on-state characteristics at room temperature of a 0.4 $mm^2$ IGBT are shown in FIG. 4 with a maximum gate bias of about −20 V. The knee voltage is about −3 V, which indicates good ohmic contacts on the emitter and collector. The differential on-resistance is 88 m$\Omega$×$cm^2$ which is the lowest value for high voltage IGBTs. Setting the power dissipation for such devices at 300 W/$cm^2$, the collector current density is approximately 50 A/$cm^2$. At this current density level, the collector voltage drop is about −8.65 V, which corresponds to a specific on-resistance of about 173 m$\Omega$×$cm^2$.

Figure 5:
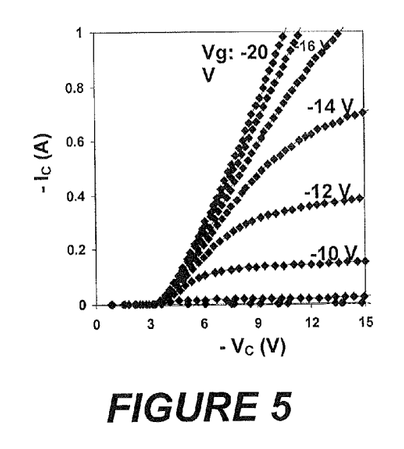

In the on-state, an IGBT according to embodiments of the invention may exhibit a positive temperature coefficient. FIG. 5 shows the I-V characteristics at 200° C. for the same device. The knee voltage stays relatively constant at −3 V. The differential on-resistance further reduces to about 25 m$\Omega$×$cm^2$ at a gate bias of −20 V. At the collector current density of 50 A/$cm^2$, the collector voltage drop reduces to about −5.30 V, which corresponds to a specific on-resistance of about 106 m$\Omega$×$cm^2$. The on-resistance reduction at high temperature may indicate that carrier lifetimes in SiC materials currently used are the dominant factor relating to IGBT on-state current conduction capability. Compared to a 10 kV-class SiC DMOSFET, an IGBT according to some embodiments of the invention still exhibits a higher voltage drop at room temperature, possibly due to insufficient resistivity modulation. However, the voltage drop becomes less than the value for the DMOSFET at high temperatures.

Figure 6:
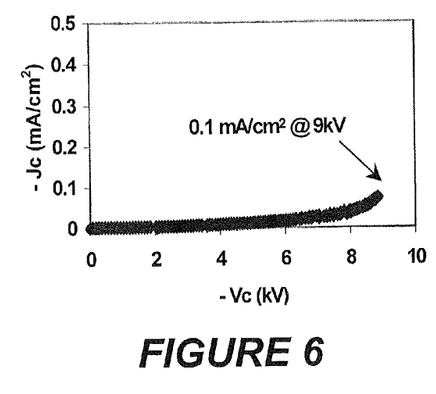
FIG. 6 is a graph of leakage current density versus blocking voltage for an IGBT device according to some embodiments of the invention.

FIG. 6 shows the voltage blocking characteristics of the same device at room temperature. In particular, an IGBT device as described above was tested with the gate electrode grounded with the emitter and immersed in Fluorinert to prevent arcing in air. As shown in FIG. 6, a 9 kV blocking voltage with a leakage current density of less than about 0.1 mA/$cm^2$ has been achieved at gate bias of 0 V. The breakdown occurs in the device termination periphery, which may indicate that there is room to approach the blocking voltage determined by the drift layer thickness with a better edge termination design.

Hole mobility and MOS threshold voltage measurements for a lateral 4 H-SiC p-MOSFET fabricated in conjunction with the IGBT show that the MOSFET device has a peak channel mobility of about 6.5 $cm^2$/V-s and a threshold voltage of about −7.5 V at room temperature. The channel mobility reaches a maximum value of about 8.2 $cm^2$/V−s at 100° C., while the threshold voltage decreases with temperature.

Figure 7:
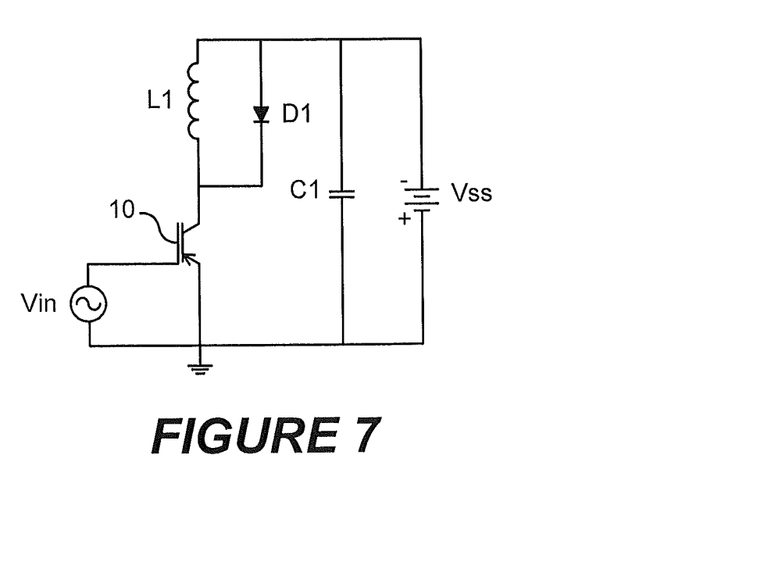
FIG. 7 is a diagram of a clamped inductive switching test circuit topology used for testing the switching characteristics of a device according to some embodiments of the invention.

Switching tests were performed on IGBT devices according to embodiments of the invention. A clamped Inductive Switching Test Circuit topology as shown in FIG. 7 was used for the switching tests. The IGBT device 10 tested in the switching tests had an active area of 4 $mm^2$ to achieve a high conduction current, but otherwise the test device had a similar design as that described above. In this test circuit, the IGBT 10 is coupled to a 1.1 mH inductive load L1 that is clamped by a freewheeling diode D1. The diode D1 includes two CREE® CSD10120 SiC Schottky diodes in series with zero reverse recovery. One CSD10120 diode is rated for 1200 V and 10 A, so two in series may provide 2400 V of blocking capability. The capacitor C1 has a capacitance of 2 µF and is capable of handling voltages up to 4 kV. A negative pulse from 0 to −20 V from the voltage source Vin was used to turn-on the IGBT. The supply voltage Vss is −500 V.

Figure 8:
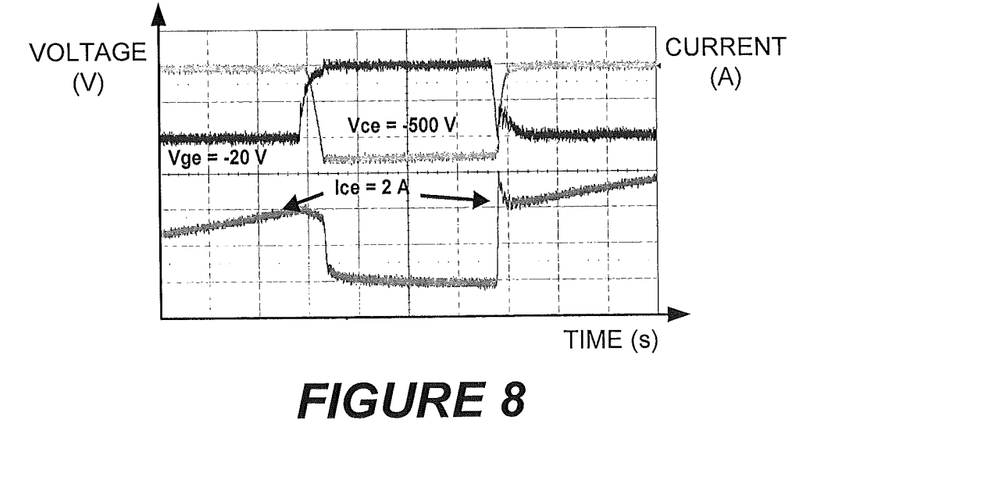
FIG. 8 is a graph of an inductive switching waveform of a device according to some embodiments of the invention.

FIG. 8 shows the switching waveforms at 25° C. with a collector voltage of −500 V. In FIG. 8, the horizontal axis measures time at 500 nsec/div, while the vertical axis measures volts at 200 V/div and current at 1 A/div. The fall time tfall is defined as the time to take the collector current to fall from 90% to 5% of its 2 A peak at turn-off. The rise time trise is the time it takes for the collector current to rise from 5% to 90% of the 2 A current peak at turn-on. The turn-on delay time is the time between the −20 gate bias being applied and the collector current rising to the 2 A peak. The turn-off delay time is the time between the removal of the gate bias and fall of the collector current towards zero.

Table 1 shows the switching times for varying temperatures. The total switching time is about 350 ns at room temperature and increases to about 460 ns at 200° C. The IGBT features a fast switching capability, which can be operated at high frequency for a wide temperature range. The turn-off delay time may be the dominant portion of the total switching time, which is primarily determined by the input capacitors.

TABLE 1

| Switching Times | | | | | |
|---|---|---|---|---|---|
| Temp. (C.) | $t_{fall}$ (ns) | $t_{rise}$ (ns) | $t_{delay(on)}$ (ns) | $t_{delay(off)}$ (ns) | $t_{total}$ (ns) |
| 25 | 64 | 14 | 40 | 220 | 338 |
| 50 | 81 | 16 | 20 | 220 | 337 |
| 100 | 51 | 10 | 18 | 220 | 299 |
| 150 | 75 | 14 | 18 | 320 | 427 |
| 200 | 77 | 7 | 36 | 340 | 460 |

SiC IGBTs according to some embodiments of the invention may be suitable for high power and/or high temperature applications. Some embodiments of the invention provide high voltage planar IGBTs on n-type 4 H-SiC substrates. In some embodiments, a differential on-resistance of about 88 mΩ×cm² at a gate bias of about −20 V is achieved at 25° C., and decreases to about 24.8 mΩ×cm² at 200° C. A device according to embodiments of the invention may exhibit a blocking voltage of about 9 kV with a leakage current density of about 0.1 mA/cm² or less. A hole channel mobility of about 6.5 cm²/V-s is achieved at room temperature with a threshold voltage of −6.5 V, resulting in enhanced conduction capability. Inductive switching tests show that IGBTs according to some embodiments of the invention may exhibit fast switching capability at both room temperature and at elevated temperatures.

IGBT devices according to some embodiments of the invention may exhibit a low on-state resistance. In particular, a high channel mobility may be achieved by using one or more of buried channel implantation/regrowth, thermal oxidation, high temperature implant activation and/or graphite encapsulation during implant activation. Some embodiments of the invention may provide an optimized cell design with a better trade-off between high channel density and low JFET resistance. Furthermore, some embodiments of the invention may provide a field stopper layer that is configured to enhance the carrier injection efficiency while maintaining a desired blocking capability. High channel mobility may be obtained through epitaxial channel regrowth and/or activation of threshold adjustment/buried channel implants using a high temperature anneal and/or graphite encapsulation. High majority carrier injection from the P-type emitter may be obtained through P-type epitaxial growth to obtain a high hole carrier concentration. Furthermore, some embodiments of the invention may provide reduced ohmic contact resistance on n-and p-type materials.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming an insulated gate bipolar transistor (IGBT) device, comprising:
   forming a p-type drift layer;
   forming an n-type well in the p-type drift layer;
   epitaxially growing a p-type channel adjustment layer on the p-type drift layer and on the n-type well;
   implanting p-type dopant ions to form a p-type emitter region that extends through the p-type channel adjustment layer and into the n-type well, the p-type emitter region at least partially defining a channel region in the n-type well adjacent the p-type emitter region;
   implanting n-type dopant ions to form an n-type connector region that is adjacent the p-type emitter region and extends through the channel adjustment layer and into the n-type well;
   forming a gate oxide layer on the channel region; and
   forming a gate on the gate oxide layer.

2. The method of claim 1, further comprising annealing the p-type dopant implanted ions and the n-type dopant implanted ions.

3. The method of claim 2, further comprising:
   forming a graphite coating on the channel adjustment layer, wherein the annealing the implanted ions comprises annealing the channel adjustment layer and the graphite coating; and
   removing the graphite coating after the annealing the implanted ions.

4. The method of claim 3, further comprising crystallizing the graphite coating before the annealing the implanted ions.

5. The method of claim 3, wherein the annealing the implanted ions comprises annealing the implanted ions at a temperature greater than 1700° C.

6. The method of claim 3, wherein the annealing the implanted ions comprises annealing the implanted ions at a temperature greater than 1800° C.

7. The method of claim 1, wherein the forming the gate oxide layer comprises forming the gate oxide layer in dry $O_2$, the method further comprising annealing the gate oxide layer in wet $O_2$.

8. The method of claim 7, wherein the forming the gate oxide layer comprises forming the gate oxide layer in dry $O_2$ at a temperature less than or equal to about 1200° C.

9. The method of claim 7, further comprising annealing the gate oxide layer in an inert atmosphere at a temperature less than or equal to about 1200° C. after the forming the gate oxide layer and before the annealing the gate oxide layer in the wet $O_2$.

10. The method of claim 7, wherein the annealing the gate oxide layer in the wet $O_2$ comprises annealing the gate oxide layer in the wet $O_2$ at a temperature less than or equal to about 950° C.

11. The method of claim 10, wherein the annealing the gate oxide layer in the wet $O_2$ comprises annealing the gate oxide layer in the wet $O_2$ for at least one hour.

12. The method of claim 7, wherein the annealing the gate oxide layer in the wet $O_2$ comprises generating pyrogenic steam in a pyrogenic chamber, supplying the pyrogenic steam to an anneal chamber, and annealing the gate oxide layer in the anneal chamber.

13. The method of claim 12, wherein the generating the pyrogenic steam comprises heating the pyrogenic chamber, supplying hydrogen and oxygen gas to the pyrogenic chamber, and combusting the hydrogen gas and the oxygen gas to form the pyrogenic steam, wherein the hydrogen gas and the oxygen gas are supplied to the pyrogenic chamber at a molecular ratio of hydrogen to oxygen of about 1.8 or more.

14. The method of claim 1, further comprising implanting p-type dopant ions into the drift layer to form a JFET region adjacent to the n-type well, and wherein the p-type emitter region is spaced apart from the JFET region and defines a channel region between the p-type emitter region and the JFET region.

15. The method of claim 1, wherein the channel adjustment layer is formed to have a thickness of about 0.1 μm to about 0.5 μm, and wherein the channel adjustment layer has a net acceptor concentration of about $1 \times 10^{16}$ cm$^{-3}$ to about $5 \times 10^{18}$ cm$^{-3}$.

16. The method of claim 1, wherein the drift layer comprises an epitaxial silicon carbide layer.

17. The method of claim 1, where the forming the p-type drift layer comprises forming the p-type drift layer on an n-type substrate.

18. The method of claim 17, wherein the substrate comprises silicon carbide.

19. The method of claim 1, wherein a distance from a bottom of the p-type emitter region to a bottom of the n-type well region is equal to or greater than about 0.45 μm.

20. A method of forming an insulated gate bipolar transistor (IGBT) device, comprising:
forming a drift layer of a first conductivity type;
forming a well of a second conductivity type in the drift layer;
forming a JFET region with first conductivity type dopant ions in the drift layer;
forming a channel adjustment layer of the first conductivity type on the JFET region and the well;
implanting first conductivity type dopant ions to form an emitter region of the first conductivity type that extends through the channel adjustment layer and into the well, wherein the emitter region is spaced apart from the JFET region by the well;
implanting second conductivity type dopant ions to form a connector region of the second conductivity type that is adjacent the emitter region and into the well;
forming a gate oxide layer on the channel region; and
forming a gate on the gate oxide layer.

21. The method of claim 20, wherein the forming the JFET region comprises epitaxially growing the JFET region with additional first conductivity type dopant ions on the drift layer.

22. The method of claim 20, wherein the forming the JFET region comprises forming the JFET region with a dopant concentration of about $1 \times 10^{16}$ cm$^{-3}$.

23. The method of claim 20, wherein the forming the JFET region comprises implanting aluminum in the drift layer adjacent the well.

24. The method of claim 20, further comprising:
forming a graphite coating on the channel adjustment layer;
annealing the implanted ions in the channel adjustment layer;
annealing the graphite coating; and
removing the graphite coating after annealing the implanted ions.

* * * * *

UNITED STATES PATENT AND TRADEMARK OFFICE
CERTIFICATE OF CORRECTION

PATENT NO.      : 9,548,374 B2                                   Page 1 of 1
APPLICATION NO. : 14/260717
DATED           : January 17, 2017
INVENTOR(S)     : Zhang et al.

It is certified that error appears in the above-identified patent and that said Letters Patent is hereby corrected as shown below:

In the Specification

Column 7, Line 60: Please correct "0.25 μ." to read -- 0.25 μm. --

Signed and Sealed this
Fifteenth Day of August, 2017

Joseph Matal
*Performing the Functions and Duties of the*
*Under Secretary of Commerce for Intellectual Property and*
*Director of the United States Patent and Trademark Office*